(12) United States Patent
Bunert

(10) Patent No.: US 6,259,606 B1
(45) Date of Patent: Jul. 10, 2001

(54) HOUSING FOR ELECTRONIC CIRCUIT IMPLEMENTABLE IN AN ELECTRONIC CARD, AND A METHOD OF MANUFACTURING SUCH A CARD

(76) Inventor: Peter Bunert, Scholossstrasse 21, D-75245 Neulingen (DE)

( * ) Notice: Subject to any disclaimer, the term of this patent is extended or adjusted under 35 U.S.C. 154(b) by 0 days.

(21) Appl. No.: 09/147,069

(22) PCT Filed: Apr. 2, 1997

(86) PCT No.: PCT/EP97/01658

§ 371 Date: Oct. 1, 1998

§ 102(e) Date: Oct. 1, 1998

(87) PCT Pub. No.: WO97/38396

PCT Pub. Date: Oct. 16, 1997

(30) Foreign Application Priority Data

Apr. 3, 1996 (DE) .............................................. 196 13 543
Apr. 3, 1996 (DE) ......................................... 296 05 937 U

(51) Int. Cl.$^7$ ........................... H05K 5/00; G06K 19/077
(52) U.S. Cl. .......................... 361/737; 361/736; 361/801; 29/856; 264/272.11; 235/492
(58) Field of Search ...................................... 361/736, 737, 361/752, 801, 807; 174/52.2, 52.3, 259; 264/272.11, 272.14, 272.15; 29/841, 856; 235/492

(56) References Cited

U.S. PATENT DOCUMENTS

| 5,164,887 | * | 11/1992 | Sakai et al. ............................ 361/683 |
| 5,321,247 | * | 6/1994 | Mroczkowski et al. .............. 235/492 |
| 5,461,256 | * | 10/1995 | Yamada et al. ....................... 257/679 |
| 5,541,813 | * | 7/1996 | Satoh et al. ............................ 361/752 |
| 5,719,746 | * | 2/1998 | Ohbuch et al. ....................... 361/737 |
| 5,735,040 | * | 4/1998 | Ochi et al. .............................. 29/841 |
| 5,894,006 | * | 4/1999 | Herbst ................................... 264/132 |

FOREIGN PATENT DOCUMENTS

| 37 07 252 | 9/1988 | (DE) . |
| 94 20 774 U | 2/1996 | (DE) . |
| 2673065 | 8/1992 | (FR) . |

* cited by examiner

*Primary Examiner*—Jayprakash N. Gandhi
(74) *Attorney, Agent, or Firm*—Brezina & Ehrlich

(57) ABSTRACT

An electronic card for electromagnetic data exchange, the electronic card including an electronic circuit (2) which is contained in a housing (1), the housing (1, 1') being provided with a bottom element (10) and a top element (20), the electronic circuit (2) being contained between inner surfaces (10', 20') of the bottom and top elements (10, 20). At least one of the bottom element (10) and the top element (20) is provided with at east one recess (11, 12, 21, 22, 11a, 12a, 21a, 22a), into which the electronic circuit (2) is inserted, the shape (11', 12', 21', 22', 11a', 12a', 21a', 22a') of the recess (11, 12, 21, 22, 11a, 12a, 21a, 22a) corresponding to an outer shape (2a', 2b', 2c'; 2a', 2c') of the electronic circuit (2), the electronic circuit (2) being at least partially covered by the top element (20), and the housing (1; 1') being encased by a sheathing (50) made of plastics.

21 Claims, 3 Drawing Sheets

HOUSING FOR ELECTRONIC CIRCUIT IMPLEMENTABLE IN AN ELECTRONIC CARD, AND A METHOD OF MANUFACTURING SUCH A CARD

BACKGROUND OF THE INVENTION

The invention relates to an electronic card for electromagnetic data exchange, the electronic card having an electronic circuit, which is contained in a housing, as well as process for manufacturing such a card.

Electronic cards with an implemented electronic circuit are already known and are used, for example, as telephone cards, as credit cards with an integrated telephone card function, etc. In these cases, the electronic circuit is contained in an hermetically-encapsulated casing and is placed upon a supporting element of the electronic card. The disadvantage of this procedure is that it can be carried out only at rather high costs, since the encapsulating of the microchip is difficult to carry out, due to the temperature sensitivity of its electronic components.

Nowadays such electronic cards are used not only for the above-mentioned functions, but they are also used as so-called transponder cards, such as electronic cards for a radio-frequency identification system for tracing luggage, for example. Here the electronic circuit consists of an antenna element and an evaluation unit connected to the antenna element via thin wires. Due to its spatial extension, such an electronic circuit can no longer be encapsulated by a simple plastics injection moulding process—like a microchip for example—since the wires connecting the antenna element and the evaluating unit of the electronic circuit would be damaged due to the pressure resulting from the injection moulding process. Therefore, at present the electronic circuit has to be sealed via a laminating process, carried out at a temperature of 130° for 20 to 30 minutes. The disadvantage of using such a procedure is that the necessary working temperature for the electronic card circuit generally reaches the limits of technological feasibility, so that during the present production of such an electronic cards a high failure rate is expected.

It must be clarified that the above-mentioned cards are cards which are neither electronic cards such as are used with personal computers for example, nor electronic cards whose casing already constitutes the final casing for the electronic card.

SUMMARY OF THE INVENTION

It is the object of the invention to develop a housing for an electronic circuit of an electronic card, which is easy to produce and which yields a proper protection for the electronic circuit contained within.

This object is achieved according to the invention in that the housing is provided with a bottom element and a top element, in that the electronic circuit is contained between the inner surfaces of these two elements, that at least one of the bottom element and the top element is provided with at least one recess, into which the electronic circuit is inserted, that the shape of the recess corresponds to the outer shape of the electronic circuit, that the electronic circuit is at least partially covered by the top element, and that the housing is encased by a sheating made of plastics.

A housing for the electronic circuit of an electronic card is created in an advantageous manner by the procedures according to the invention and this housing can be produced via a simple plastics injection moulding process in a convenient way. The recesses according to the invention, provided at least within the bottom element of the housing, make it advantageously possible to incorporate even spatially extended electronic circuits, which are contained within the housing, safe and protected form outer temperatures, after the top element has been placed upon the bottom element and the two elements have been connected, if required. Subsequently, in order to produce the actual electronic card, the housing according to the invention can be placed, together with the electronic circuit protected from mechanical and/or thermal influences, into a plastics injection moulding machine and the injection moulding process can then be carried out.

An advantageous further development of the invention provides that at least one of the bottom element and the top element of the housing according to the invention are provided with at least two spatially separate recesses for receiving two separate components of the electronic circuit, whereby these two recesses are connected via at least one recess for receiving wires connecting the two abovementioned components. Such a design has the advantage that in this way even electronic circuits consisting of several spatially separate components can be contained in a convenient manner within the housing according to the invention, protected from mechanical and/or thermal influences.

Another advantageous development of the invention provides that one of the two recesses provided serves to receive an antenna element and the other recess serves to receive an evaluation unit of the electronic circuit. This design is particularly suitable for an electronic card that is to be used as a radio-frequency identification system.

In an advantageous further development of the invention, the housing is made of an elastic material. Thus a flexible construction of the electronic card is obtained in a convenient manner.

BRIEF DESCRIPTION OF THE DRAWINGS

Further details and advantages of the invention can be noted from the exemplary embodiments which are described below by means of the figures.

DESCRIPTION OF THE PREFERRED EMBODIMENTS

Figure 1:
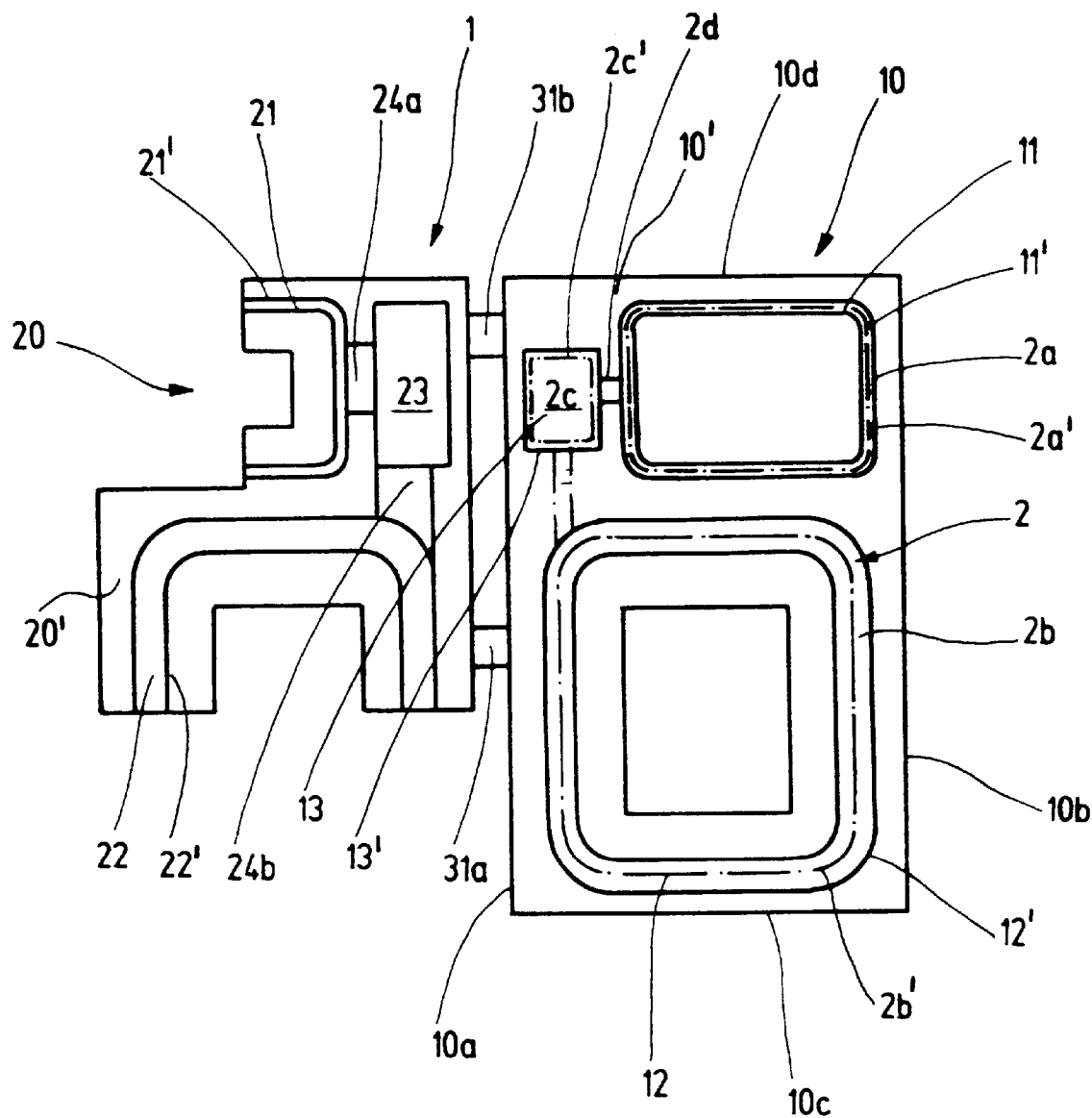
FIG. 1 shows a first exemplary embodiment of a housing for the electronic circuit of an electronic card.

The exemplary embodiment of FIG. 1, representing a housing 1 for receiving an electronic circuit 2 (shown here merely schematically and in a dotted line), mainly consists of a bottom element 10 and a top element 20 which are connected via connecting elements 31a, 31b in such a way that top element 20 can be folded over onto the bottom element 10, so that the inner surface 10' of the bottom element 10 comes into contact with the inner surface 20' of the top element 20. It must be noted here that, although it is convenient to connect the bottom element 10 and the top element 20 via the connecting elements 31a, 31b, it is also possible to omit these connecting elements 31a, 31b, so that the housing 1 then consists of two separate parts 10, 20.

The bottom element 10 of the housing 1 is basically rectangular, its shape limited by longitudinal edges 10a and 10b and by cross edges 10c and 10d. Here the size of the bottom element 10 is somewhat smaller than the size of an electronic card using the already described housing 1. The bottom element 10 is provided with two recesses 11 and 12 serving to receive a first antenna element 2a and a second antenna element 2b respectively, of the electronic circuit 2. The bottom element 10 is further provided with an opening 13 for a microchip 2c, which is be accessible from the surface of the electronic card. As it can be seen from FIG. 1, the shapes 11', 12' of the recesses 11, 12 and the shape 13' of the opening 13 correspond to the outer shapes 2a', 2b', 2c' of the respective components 2a, 2b, 2c of the electronic circuit 2, so that these components 2a–2c of the electronic circuit 2 are essentially contained in a fixed position within the bottom element 10 of the casing device 1.

The top element 20 of the casing device 1 is shaped in such a way that when the top element 20 is folded via the connecting elements 31a, 31b onto the bottom element 10, those areas of the electronic circuit 2 to be protected from mechanical and/or thermal influences are covered by the top element 20. Thus the top element 20 is provided with a further recess 21 cooperating with the recess 11 of the bottom element 10, as well as with one further recess 22 cooperating with the recess 12 of the bottom element 10, both recesses are positioned at least partially above the recesses 11 or 12 respectively, when the housing 1 is in its assembled state. It is now assumed for the purpose of illustration only that the electronic circuit 2 does not require that the right part (as shown in FIG. 1) of the first antenna element 2a contained within the recess 11 is to be protected from thermal and/or mechanical influences by the top element 20. Therefore, the upper are a of the top element 20 does not extend over the entire width b of the antenna element 2a, but is shortened in this direction. In the same way, assuming that the lower part of the second antenna element 2b, when contained in the recess 12, does not have to be protected from the above-mentioned influences, the top element 20 is designed in such a way that is does not cover the lower area of the second antenna element 2b of the electronic circuit 2.

In a corresponding way, the top element 20 of the housing 1 is provided with an opening 23 for the microchip 2c of the electronic circuit. In order to be able to Contain the connecting wires 2d, whose diameter is typically 6/100 mm and which serve to connect the electronic components 2a–2c of the electronic circuit 2, within the housing 1, protected from heat and tearing, the top element 20—as shown in FIG. 1—is provided with recesses 24a, 24b for the connecting wires 2d which connect the opening 23 with the recesses 21, 22. It should be noted here that it is also possible to provide these recesses 24a, 24b within the bottom element 10 of the housing 1 as well, and that in this case it is eventually possible to omit the recesses 24a, 24b of the top element 20 of the housing 1. It is further possible to use a foil instead of the connecting wires 2d.

From the above description the skilled person can see that in the top element as well, the design and arrangement of the recesses 21, 22 and of the opening 23 correspond to the outer shapes 2a', 2b', 2c' of the electronic components 2a–2c of the electronic circuit 2 which is to be contained within an inner space of the housing 1, this inner space being limited by the inner surfaces 10' and 20' of elements 10, 20. It is important here only that these recesses 11, 12 and 21, 22 respectively and openings 13, 23 respectively are designed in such a way that the electronic components 2a–2c of the electronic circuit 2 can be contained within the above-mentioned recesses and openings in a way that sufficiently protects them from mechanical and/or thermal damage.

The above-described construction has the advantage that the housing 1 can be produced in an easy-to-carry-out step of operation via a plastics injection-moulding process, whereby an elastic plastic material can conveniently be used for producing the housing 1. It is however possible to use a rigid plastic material as well for producing the housing 1.

After the housing 1 has been designed as described above, the components 2a–2d of the electronic circuit 2 are inserted into recesses 11, 12 of the bottom element 10. The top element 20 is then folded via the connecting elements 31a, 31b onto the bottom element 10, whereby the connecting wires 2d are received within the recesses 24a, 24b of the top element 20. After that, the bottom element 10 is connected to the top element 20 at least at pre-determined points—preferably by means of bonding, engaging via notches, clamping or welding—so that the top element 20 is firmly fixed onto the bottom element 10. In this way, a safety feature for transport purposes is created for the electronic circuit 2 as well, which prevents the electronic circuit 2 from becoming detached during handling or transport.

The entity created in this way is then placed into a plastics injection-moulding machine and is encased via a plastics injection moulding process in order to create the actual ready-to-use electronic card, whereby the non-sensitive areas of the electronic components 2a–2d which are not covered by the top element 20 are now encased by sheathing.

The above-described housing 1 for receiving the electronic circuit 2 of the electronic card excells by the fact that the housing 1, containing and protecting the electronic circuit 2, can be produced simply and thus inexpensively via a plastics injection-moulding process. In addition, it is possible to produce flexible electronic cards in this way.

Figure 2:
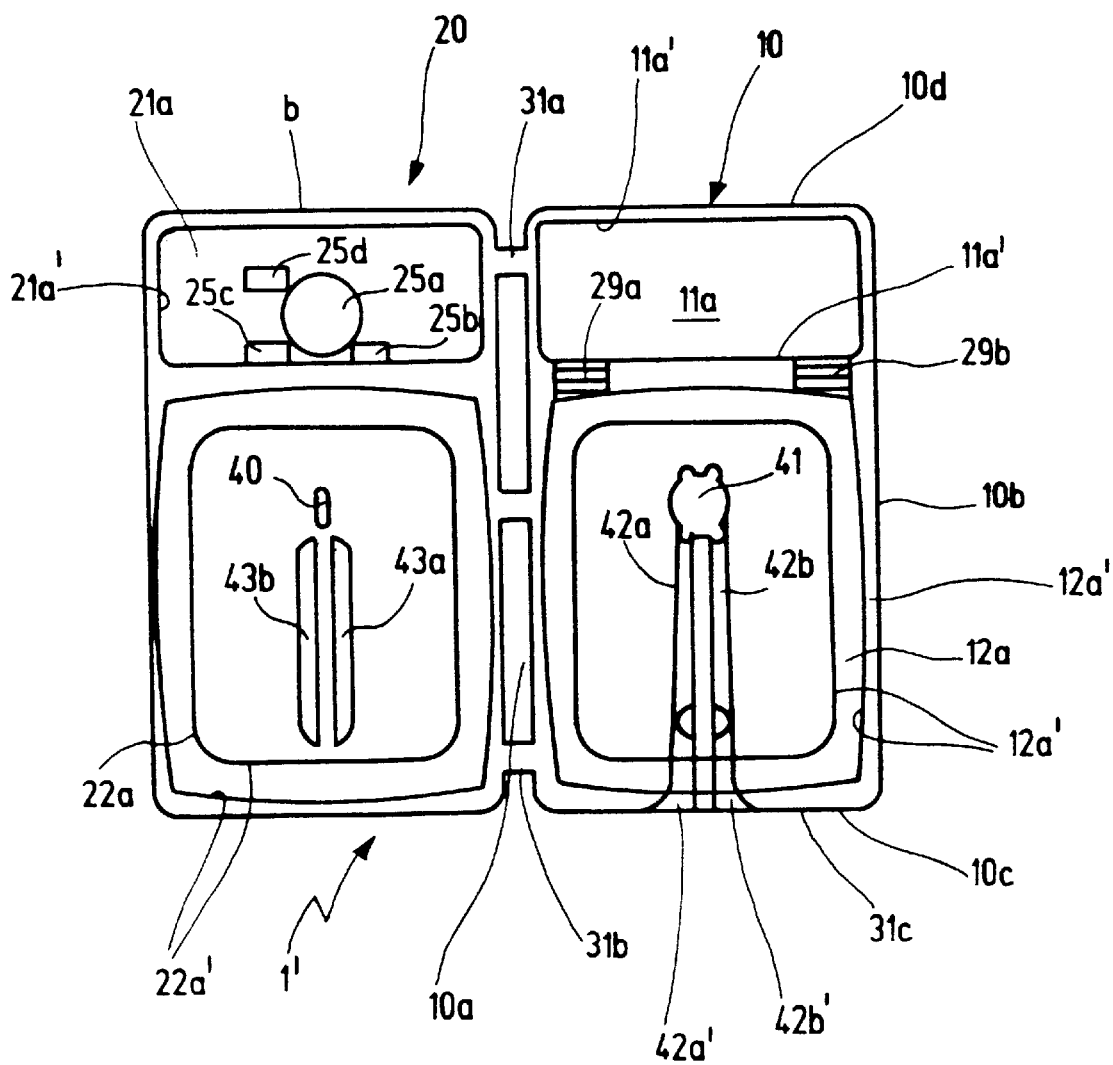
FIG. 2 shows a second exemplary embodiment of a housing for the electronic circuit of an electronic card.

FIG. 2 shows a second exemplary embodiment of a housing 1', the basis construction of which corresponds to that of housing 1 shown in FIG. 1, so that the same and corresponding parts may be marked with the same reference numbers and need not be described in detail again.

One of the differences between housing 1 and housing 1' lies in the fact that the bottom element 10 and the top element 20 are essentially of the same size, i.e. that the top element 20, when folded over onto the bottom element 10, essentially covers the bottom element 10 entirely. The expert can see clearly that such a difference between the bottom and top elements 10, 20 of the two embodiments represents an optionally different variation of the construction principle of the first exemplary embodiment.

Furthermore, in the case of housing 1', the bottom element 10 and the top element 20 are no longer connected via two connecting elements 31a, 31b, but via three connecting elements 31a, 31b, 31c. This is merely another way of many different ways in which the bottom element 10 can be connected with the top element 20. With regards to housing 1', it is of course possible as well to omit the connecting element 31a, 31c, so that the housing 1' then consists of the separate parts 10, 20.

The bottom element 10 of housing 1' is provided with two recesses 11a and 12a, corresponding to the recesses 11 and 12 of housing 1, whereby recess 11a now serves to receive the microchip 2c (cf. FIG. 3), and recess 12a serves to receive the antenna element 2a. As can be seen clearly from FIG. 2 and FIG. 3, the shapes 11a' and 12a' of recesses 11a, 12a correspond to the shapes 2a', 2c' of the respective components 2a, 2c of the electronic circuit 2, so that for the housing 1' these components 2a, 2c of the electronics circuit 2 are essentially contained in a fixed position within the bottom element 10 of housing 1'.

In the same way as for housing 1, the top element 20 of the housing 1' is provided with a further recess 21a cooperating with the recess 11a of the bottom element 20, as well as with one further recess 22a cooperating with recess 12a of the bottom element 10. These recesses 21a, 22a are positioned above recesses 11 and 12a respectively, when the housing 1'is in its assembled state.

Like in housing 1, in housing 1' the microchip 2c contained within recess 1a is protected from thermal and/or mechanical influences by the top element 20. The upper area of the top element 20 of housing 1'—unlike that of housing 1 shown in FIG. 1—therefore extends here over the entire width b of the top element 20. In a corresponding manner, the antenna element 2a contained within recess 12a is fully covered by the top element 20, so as to protect the antenna element 2a from mechanical and/or thermal influences.

As it can be seen from FIG. 2, in order to obtain a better adjustment of the recess 21a to the component 2c to be received therein, recess 21a of the top element 20 of the housing 1' is provided with recesses 25a–25d for the purpose of better adjustment of recess 21a to the structure of the microchip 2c to be received therein.

It can be further seen from FIG. 2 that the bottom element 10 is provided with two clamp elements 29a, 29b for connecting wires 2d (not shown in FIG. 2) which serve to connect the microchip contained within the recess 11a and the antenna element 2a contained within the recess 12a. By means of these clamp elements 29a, 29b, the connecting wires 2d are pushed against the top element 20 of the housing 1' and are thus held in place. It is also possible, however, that one or both clamp elements 29a, 29b are arranged at the top element 20.

Another difference between the two embodiments is the fact that the housing 1' is provided with an opening 40, arranged essentially in the centre of its top element 20, which is positioned above an recess 41 of the bottom element 10 when the housing 1 is folded over. Two channels 42a, 42b within the bottom element 10 extend from recess 41 to the edge 10c of the bottom element 10. They are covered by corresponding covers 43a, 43b within the top element 20 when the housing 1 is folded over. Of course it is also possible, as an alternative, to provide the opening 40 within the bottom element 10 and to arrange the components 41a, 42a, 42b within the top element 20 of the housing 1'.

Figure 3:
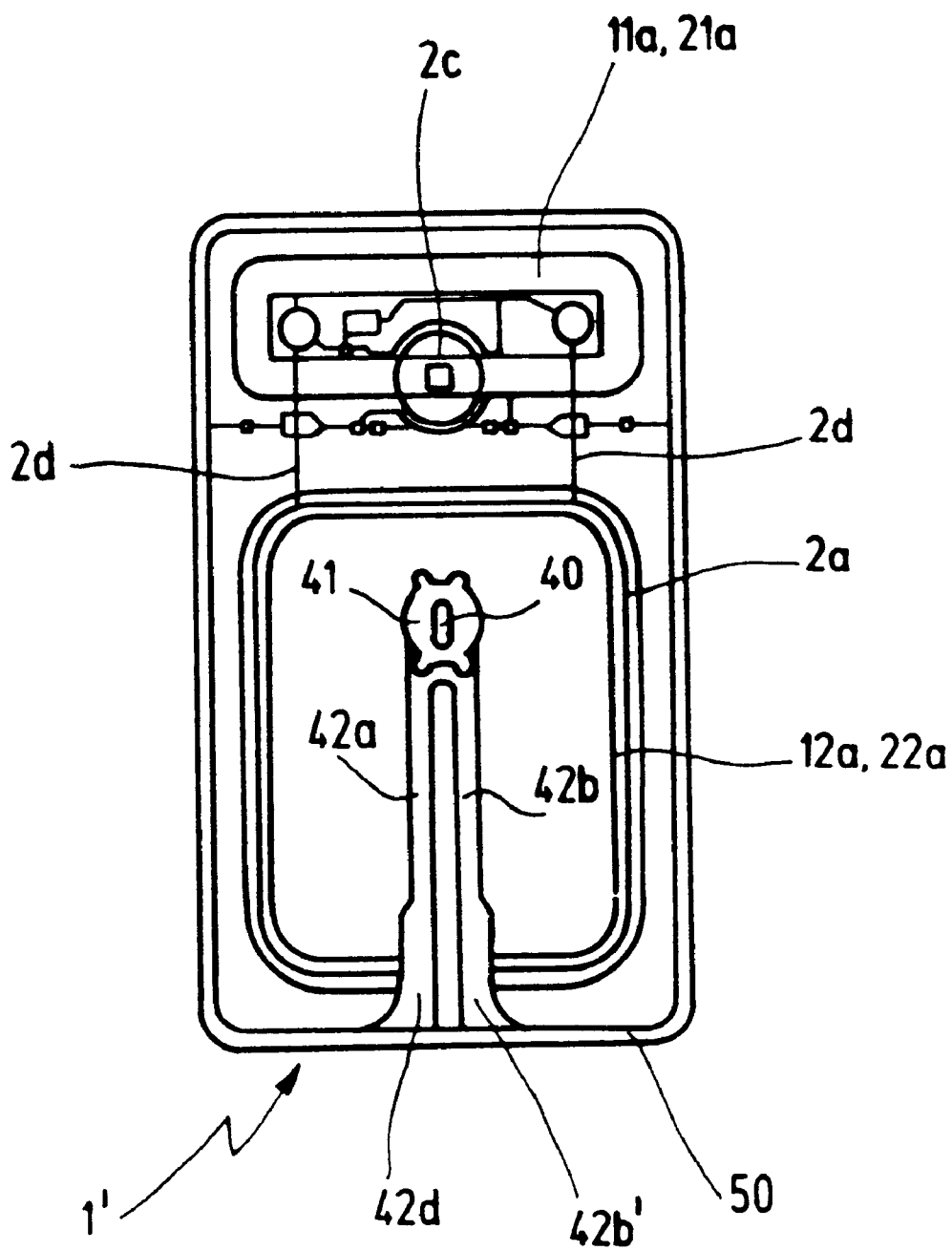
FIG. 3 shows an electronic card constructed from the housing of FIG. 2.

The opening 40 within the top element 20 as well as the channels 42a, 42b within the bottom element 10 serve for the purpose of producing, from the centre of the housing 1', the sheathing 50, seen in FIG. 3, of the housing 1' for the manufacturing of the actual card. This is done by placing the housing 1'in its folded-over state, whereby the components 2a, 2c to be protected by the housing 1' are contained with the housing 1' and are covered by the bottom element 10 and the top element 20, into a plastics injection-moulding machine in such a way that a narrow free space remains along the circumference of the housing 1'. The injection-moulding material is then conveyed via the opening 40 into the channels 42a, 42b and passes through these channels 42a, 42b to their outlet openings 42a', 42b', thereafter encasing the housing 1 in order to produce the actual electronic card, whereby the injection moulding material flows along the outer edge of the housing 1', thus forming the seamless sheathing 50. The advantage of such a procedure is the fact that the surface of the housing 1' can be hermetically sealed. In addition, there is advantageously no breakage of the housing 1' when bending stresses occur.

What is claimed is:

1. An electronic card for electromagnetic data exchange, the electronic card including an electronic circuit (2) which is contained in a housing (1), the housing (1, 1') comprising a bottom element (10) and a top element (20), the electronic circuit (2) being contained between inner surfaces (10', 20') of the bottom and top elements (10, 20), at least one of the bottom element (10) and the top element (20) being provided with at least one recess (11, 12, 21, 22, 11a, 12a, 21a, 22a), into which the electronic circuit (2) is inserted, the shape (11', 12', 21', 22', 11a', 12a', 21a', 22a') of the recess (11, 12, 21, 22, 11a, 12a, 21a, 22a) corresponding to an outer shape (2a', 2b', 2c'; 2a', 2c') of the electronic circuit (2), the electronic circuit (2) being at least partially covered by the top element (20), and the housing (1; 1') being encased by a sheathing (50) made of plastics.

2. The electronic card according to claim 1, wherein the housing (1; 1') is produced via an injection molding process.

3. The electronic card according to claim 1, wherein at least one of the bottom element (10) and the top element (20) of the housing (1) is provided with at least one opening (13, 23) into which an electronic component (2c) can be inserted.

4. The electronic card according to claim 1, wherein at least one of the bottom element (10) and the top element (20) is provided with recesses (24a, 24b) for receiving connecting elements (2d) serving to connect components (2a–2c) of the electronic circuit (2).

5. The electronic card according to claim 1, wherein the top element (20) is connected to the bottom element (10) of the casing device (1; 1') via connecting elements (31a, 31b; 31a–31c), and the top element (20) can be folded via the connecting elements (31a, 31b; 31a 31c) onto the bottom element (10).

6. The electronic card according to claim 1, wherein the bottom element (10) and the top element (20) of the housing (1) are connected via bonding, welding, engaging via notches or via clamping, with each other.

7. The electronic card according to claim 1, wherein the bottom element (10) is of an essentially rectangular shape limited by two longitudinal edges (10a, 10b) and by two cross edges (10c, 10d), or of a circular, oval or polygonal shape and the bottom element (10) has a surface of a size somewhat smaller than that of the electronic card.

8. The electronic card according to claim 1, wherein the recesses (21, 22; 21a, 22a) of the top element (20) are positioned above the recesses (11, 12; 11a, 12a) of the bottom element (10) of the housing (1; 1') when the housing (1; 1') is in an assembled state.

9. The electronic card according to claim 1, wherein the housing (1; 1') is made of elastic or rigid plastic material.

10. The electronic card according to claim 1, wherein the top element (20) of the housing (1) does not extend over the entire width of the bottom element (10) in at least one area when the casing device is in a folded-over state.

11. The electronic card according to claim 1, wherein the top element (20) and the bottom element (10) of the housing (1') essentially overlap one another when the housing (1') is in a folded-over state.

12. The electronic card claim 1, wherein one of the top and bottom elements (10, 20) of the housing (1') is provided with an opening (40) through which an injection-moulding material can be conveyed, the opening (40) being connected to at least one channel (42a, 42b) running towards an edge of the housing (1'), so that an injection-moulding material which is conveyed via the opening (40) can pass through at least one channel (42a, 42b) inside the housing (1') towards the edge of the housing (1).

13. The electronic card according to claim 1, wherein the first recess (11a, 21a) and the second recess (12a, 22a) of the bottom element (10) and/or the top element (20) of the housing (1') are connected by clamp elements (29a, 29b), by means of which connecting wires (2d) serving to connect the two components (2a, 2c) of the electronic circuit (2) can be pushed against the top element (20) and/or the bottom element (10) of the housing (1').

14. The electronic card according to claim 1, wherein at least one of the electronic components contained within the recesses (11, 12; 21, 22; 11a, 12a, 21a, 22a) of the bottom element (10) and the top element (20) of the housing (1; 1') is an antenna element (2a, 2b) or a microchip (2c).

15. A process for the manufacturing of an electronic card provided with an electronic circuit (2) for electronic data exchange, comprising the steps of providing a housing (1; 1') with a bottom element (10) and a top element (20) made via a plastic injection-moulding process, the bottom element (10) and/or top element (20) being provided with at least one recess (11, 12, 21, 22; 11a, 12a, 21a, 21b), inserting components (2a–2d) of the electronic circuit (2) into at least one recess (11, 12; 11a, 12a) of the bottom element (10), fixing the top element (20) onto the bottom element (10) in such a way that the electronic circuit (2) received within the recesses (11, 12) of the bottom element (10) is at least partially covered by the top element (20), and encasing the housing (1) in plastic material by injection molding in order to create the electronic card.

16. The process according to claim 15, wherein the bottom element (10) and the top element (20) of the housing (1; 1') are connected to each other via connecting elements (31a, 31b; 31a–31c).

17. The process according to claim 15, wherein at least one of the bottom element (10) and the top element (20) of the housing (1) is provided with at least two recesses (11, 12, 21, 22; 11a, 12a, 21a, 22a), and at least one of the bottom element (10) and the top element (20) is provided with recesses (24a, 24b) for connecting wires (2d) of the electronic circuit (2).

18. The process according to claim 15, wherein at least two clamp elements (29a, 29b) for connecting wires (2d) of the electronic circuit (2) are provided in the bottom element (10) and the top element (10) of the housing (1').

19. The process according to claim 15, wherein the bottom element (10) and the top element (20) of the housing (1; 1') are connected at least partially in order to fix the top element (20) onto the bottom element (10).

20. The process according to claim 15, wherein the housing (1; 1') is made of an elastic plastic material.

21. The process according to claim 15, wherein the housing (1; 1') is made of a rigid plastic material.

* * * * *